US012610781B2

(12) United States Patent
De Vries et al.

(10) Patent No.: US 12,610,781 B2
(45) Date of Patent: Apr. 21, 2026

(54) BASE PLATE AND SUBSTRATE ASSEMBLY

(71) Applicant: ASML NETHERLANDS B.V., Veldhoven (NL)

(72) Inventors: Gosse Charles De Vries, Veldhoven (NL); Dennis Dominic Van Der Voort, Best (NL)

(73) Assignee: ASML NETHERLANDS B.V., Veldhoven (NL)

( * ) Notice: Subject to any disclaimer, the term of this patent is extended or adjusted under 35 U.S.C. 154(b) by 524 days.

(21) Appl. No.: 18/024,042

(22) PCT Filed: Aug. 10, 2021

(86) PCT No.: PCT/EP2021/072239
§ 371 (c)(1),
(2) Date: Feb. 28, 2023

(87) PCT Pub. No.: WO2022/058094
PCT Pub. Date: Mar. 24, 2022

(65) Prior Publication Data
US 2023/0290665 A1     Sep. 14, 2023

(30) Foreign Application Priority Data

Sep. 16, 2020     (EP) ..................................... 20196356
Jun. 16, 2021     (EP) ..................................... 21179678

(51) Int. Cl.
*H01L 21/78* (2006.01)
*H10P 72/70* (2026.01)
*H10P 72/76* (2026.01)

(52) U.S. Cl.
CPC .......... *H10P 72/74* (2026.01); *H10P 72/7616* (2026.01)

(58) Field of Classification Search
CPC ........... H01L 21/6835; H01L 21/68757; H01L 2221/68304; G03F 7/70708; G03F 7/70783
USPC ......................................................... 438/155
See application file for complete search history.

(56) References Cited

U.S. PATENT DOCUMENTS

| | | | |
|---|---|---|---|
| 6,020,964 A | 2/2000 | Loopstra et al. | |
| 6,952,253 B2 | 10/2005 | Lof et al. | |
| 7,564,129 B2 * | 7/2009 | Nakanishi | F28F 3/12 257/713 |
| 7,649,611 B2 * | 1/2010 | Zaal | G03F 7/70775 355/72 |

(Continued)

FOREIGN PATENT DOCUMENTS

| | | |
|---|---|---|
| WO | 2016142237 | 9/2016 |
| WO | 2019049588 | 3/2019 |

OTHER PUBLICATIONS

International Search Report and Written Opinion issued in corresponding International Application No. PCT/EP2021/072239, dated Nov. 15, 2021.

*Primary Examiner* — Vu A Vu
(74) *Attorney, Agent, or Firm* — Pillsbury Winthrop Shaw Pittman, LLP42

(57)     ABSTRACT

A base plate configured to be attached to a semiconductor substrate, wherein the base plate is configured to remain attached to the semiconductor substrate during a sequence of processing steps performed on the semiconductor substrate, and the base plate is made from a material having a Young's modulus larger than 300 GPa.

20 Claims, 6 Drawing Sheets

(56)                         References Cited

U.S. PATENT DOCUMENTS

| | | | | | |
|---|---|---|---|---|---|
| 8,268,114 | B2 * | 9/2012 | Masumura | .............. | B24B 37/30 |
| | | | | | 451/388 |
| 8,298,379 | B2 * | 10/2012 | McHugh | ........... | H01J 37/32477 |
| | | | | | 204/192.1 |
| 8,514,370 | B2 | 8/2013 | De Jong | | |
| 8,569,890 | B2 * | 10/2013 | Morishita | .............. | H01L 23/13 |
| | | | | | 257/772 |
| 8,705,010 | B2 | 4/2014 | De Boer et al. | | |
| 8,908,143 | B2 * | 12/2014 | Tromp | ................ | G03F 7/70875 |
| | | | | | 355/72 |
| 8,991,330 | B2 | 3/2015 | De Jong | | |
| 9,442,395 | B2 * | 9/2016 | Lafarre | ................... | B22F 7/062 |
| 9,460,954 | B2 | 10/2016 | De Jong et al. | | |
| 9,507,275 | B2 * | 11/2016 | Lafarre | ............... | G03F 7/70733 |
| 9,613,846 | B2 * | 4/2017 | Raj | ..................... | H01L 21/6875 |
| 9,645,511 | B2 | 5/2017 | De Boer et al. | | |
| 9,665,013 | B2 | 5/2017 | De Boer et al. | | |
| 10,078,274 | B2 | 9/2018 | De Jong et al. | | |
| 10,679,885 | B2 * | 6/2020 | Boyd, Jr. | ............ | H01L 21/6875 |
| 11,390,944 | B2 * | 7/2022 | Harashima | .......... | C23C 16/4405 |
| 11,817,339 | B2 * | 11/2023 | Hidaka | ................... | C04B 35/64 |
| 2004/0182321 | A1 * | 9/2004 | Kuibira | ............ | H01L 21/68792 |
| | | | | | 118/728 |
| 2007/0058173 | A1 | 3/2007 | Holzapfel | | |
| 2009/0170025 | A1 | 7/2009 | De Laat et al. | | |
| 2015/0200254 | A1 | 7/2015 | Diduck et al. | | |
| 2015/0331337 | A1 | 11/2015 | Sundarrajan et al. | | |
| 2016/0167358 | A1 | 6/2016 | Tang et al. | | |
| 2021/0391299 | A1 * | 12/2021 | Kaji | ........................ | H01L 23/24 |

* cited by examiner

700

900

1000

BASE PLATE AND SUBSTRATE ASSEMBLY

CROSS-REFERENCE TO RELATED APPLICATIONS

This application claims priority of EP application 20196356.8 which was filed on Sep. 16, 2020 and EP application 21179678.4 which was filed on Jun. 16, 2021 which are incorporated herein in its entirety by reference.

FIELD

The present invention relates to a base plate, a substrate assembly comprising a semiconductor substrate and a base plate attached to it, a method of processing a semiconductor substrate, an apparatus for assembling a base plate and a semiconductor substrate and a lithographic apparatus. The present invention in particular relates to a base plate which can be attached to a semiconductor substrate and which can remain attached during a sequence of processes performed on the semiconductor substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In order to ensure proper operation of the semiconductor device that is manufactured, it is essential to obtain a good alignment between consecutive layers that are patterned onto the target portions of a substrate. During the patterning of a particular layer, the substrate is held firmly on an object table, also referred to as clamping the substrate. After the patterning, the substrate is released and transferred to one or more further apparatuses to process the patterned layer. When a subsequent layer is to be patterned, the substrate is clamped again onto the object table.

It has been observed that the state in which the substrate is clamped to an object table is difficult to reproduce. The state in which a substrate is clamped onto an object table may thus be different for each layer that is to be patterned. Due to this difference, a deformation of the substrate, e.g. caused by the clamping process, may be different for each layer as well, rendering it difficult to obtain an accurate alignment between patterns of consecutive layers.

SUMMARY

It is an object of the present invention to provide an improved reproducibility of a clamping process of a substrate during a lithographic processing.

According to a first aspect of the invention, there is provided a base plate configured to be attached to a semiconductor substrate, whereby the base plate is configured to remain attached to the semiconductor substrate during a sequence of processing steps performed on the semiconductor substrate, and whereby a thickness of the base plate is in a range between 50% to 200% of a thickness of the semiconductor substrate.

According to a second aspect of the invention, there is provided a substrate assembly comprising a semiconductor substrate and a base plate according to the first aspect of the invention, whereby the semiconductor substrate is attached to the base plate.

According to a third aspect of the invention, there is provided a method of processing a semiconductor substrate, the method comprising:
   attaching the semiconductor substrate to a base plate;
   performing a sequence of processing steps on the semiconductor substrate while the semiconductor substrate remains attached to the base plate;
   detaching the base plate from the semiconductor substrate.

According to a fourth aspect of the invention, there is provided an apparatus for attaching a base plate to a semiconductor substrate, the apparatus comprising:
   a support member configured to support a base plate;
   a transport unit configured to receive the semiconductor substrate and position the semiconductor substrate;
   a processing unit configured to releasably attach the semiconductor substrate to the base plate.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
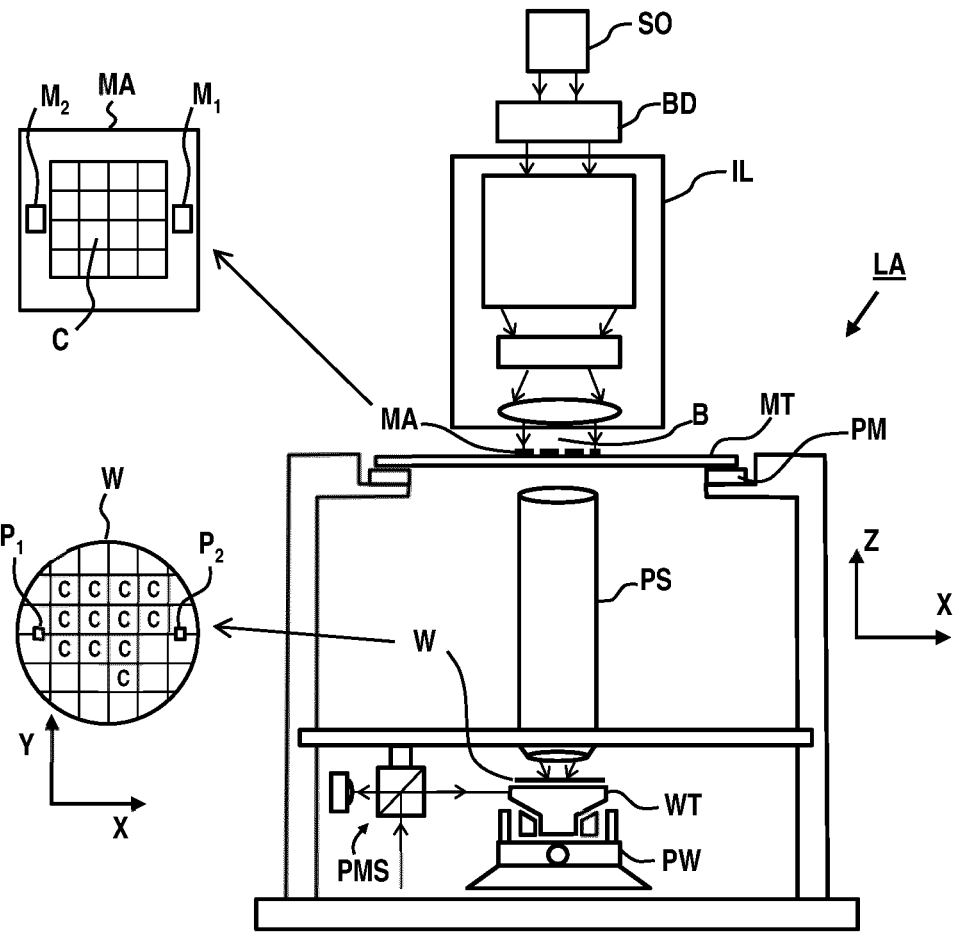
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W. In an embodiment, the substrate support may e.g. comprise an object table according to the invention.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W 13 which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
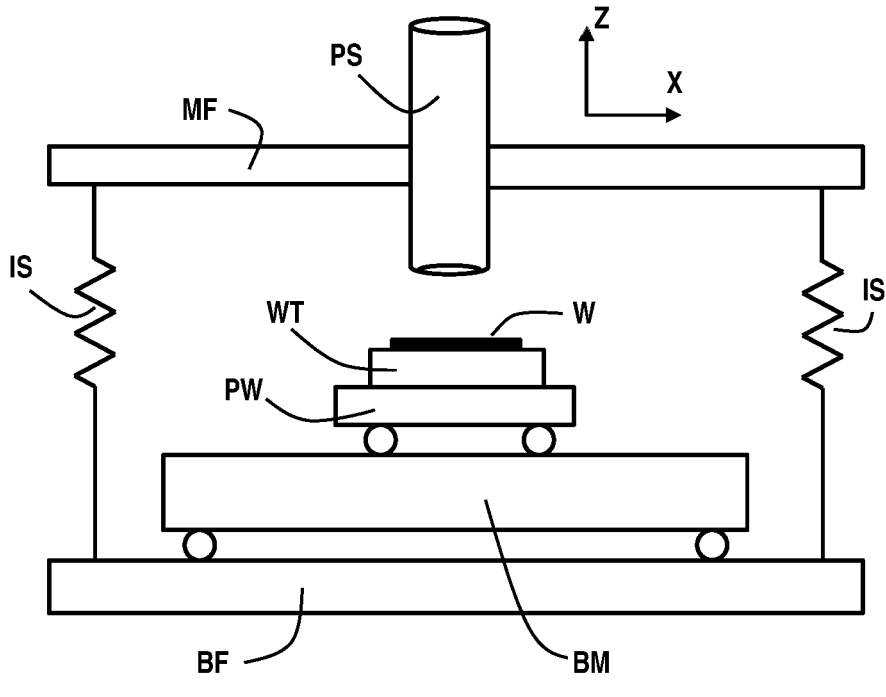
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electro-magnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
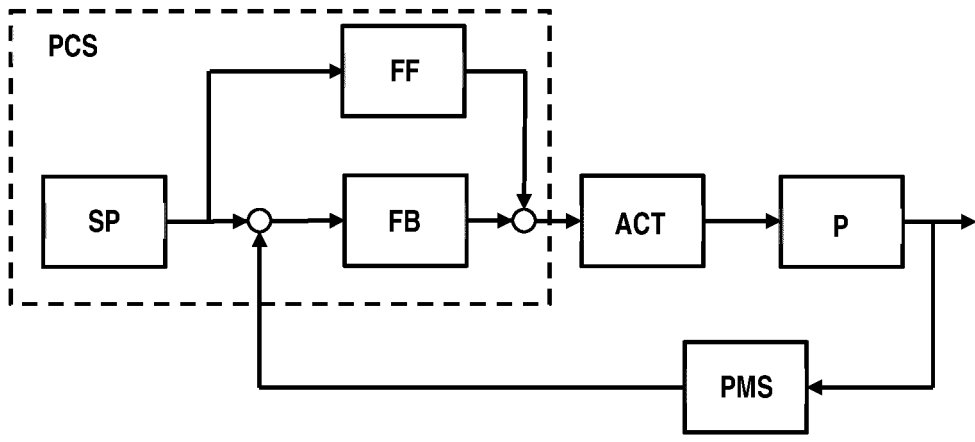
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

In a conventional lithographic process, a substrate, or wafer, is processed by placing the substrate on a table, and, when required, holding or clamping it onto the table. Typical dimensions of such a substrate that is handled are a diameter of 200, 300 or 450 mm, 300 mm or 400 mm, and a thickness in a range between 0.5 mm and 1 mm, e.g. 775 μm or 925 μm. As such, a substrate can be considered a comparatively thin, disc-shaped component. Due to its flexibility, it may undergo some deformations in between two consecutive lithographic patterning processes. Such deformations may e.g. be caused by the processes that the substrate is subjected to in between the consecutive patterning processes, such processes e.g. being the application or removal of a resist layer, a development of a resist layer, etc. In addition, a deformation of the comparatively thin substrate may be caused by the clamping process that is performed when the substrate is mounted to the substrate table of the lithographic apparatus, e.g. the substrate table WT described above. Since the patterning process as performed by the lithographic apparatus involves high accelerations and decelerations of the substrate table WT, the substrate, e.g. substrate W, needs to be firmly clamped to the table, so as to maintain the position of the substrate relative to the table.

Both the clamping process and the processes applied to the substrate prior to the clamping may render it difficult to ensure that the substrate is in the same state or shape when a next layer is to be patterned on it. As a result, the positions of the target portions, or parts thereof, of the substrate may have different positions compared to when the previous layer was patterned. This difference may contribute to an alignment error between the consecutive patterns as applied to the substrate.

As already suggested above, a cause of this difference in clamped state may be attributed to the fact that the substrate is comparatively thin and relatively flexible. As result, the substrate will, to certain extent, comply to the shape of the substrate table it is clamped to. In case consecutive layers on a semiconductor substrate are patterned using different litho-graphical apparatuses, the difference in the clamped state or shape will also be affected by the use of different substrate tables.

Figure 4:
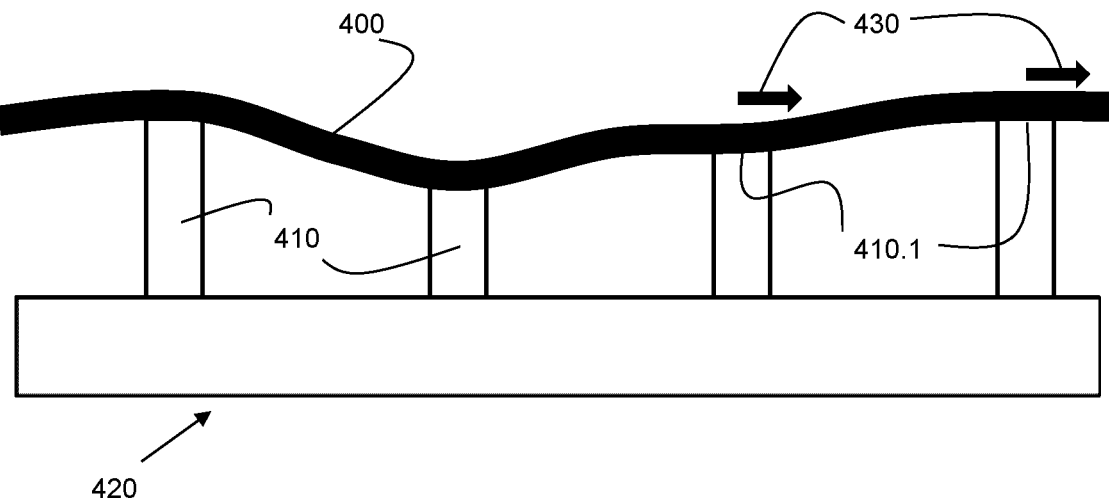
FIG. 4 schematically depicts the clamping of a substrate on an object table.

FIG. 4 schematically illustrates how a substrate's shape is affected when clamped to a substrate table. FIG. 4 sche-matically shows a portion of a substrate 400 when mounted on a plurality of burls 410 of a substrate table 420. Due to wear or manufacturing tolerances, the burls 410 of a sub-strate table 420 may e.g. have different heights causing local height variations in the clamped substrate 400. The substrate 400 may thus be clamped at an angle relative to the horizontal plane, when considered locally. Friction between the end-surfaces 410.1 of the burls and the substrate may cause an in-plane deformation of the substrate 400, illus-trated by the arrows 430. The local angle variations and the in-plane deformations adversely affect the accuracy at which a pattern can be projected at the required target portion on the substrate, i.e. it may cause an overlay error. When an exposed substrate is taken off the substrate table, it may relax to its nominal shape, i.e. a shape without the local angle variations and in-plane deformations. As such the exposed patterns on the substrate will be deformed or displaced compared to the projected pattern. When a next pattern is to be projected, the substrate will be in a different clamped state, e.g. on a different substrate table, which is likely to have different local angle variations and in-plane deformations. Due to this different clamped state, it will be difficult to exactly align the next pattern on the previously exposed pattern.

The present invention provides a method to limit the occurring deformations of a substrate that are caused by clamping and unclamping operates that are executed on substrates during the performance of a sequence of pro-cesses. Such a sequence of processes refer, within the meaning of the present invention, to processing steps of the fabrication and inspection of semiconductor components.

In accordance with the invention, it is proposed to attach a base plate to the substrate, in particular a semiconductor substrate, whereby said base plate is configured to remain attached to the substrate during a sequence of processing steps that are performed on the substrate. In accordance with the invention, the thickness of the base plate is selected to be at least 50% of the thickness of the substrate. Typical thicknesses of substrates are 775 μm for a 300 mm substrate, 725 μm for a 200 mm substrate and 925 μm for a 450 mm substrate. By having a base plate having a thickness of at least 50% of the substrate thickness has been found to have an important impact on the occurring deformations, e.g. deformations caused by a clamping process. In a preferred embodiment, the thickness of the base plate is selected to be in a range between 50% and 500% of the thickness of the substrate, more preferably in a range between 50% and 200% of the thickness of the substrate. In case the thickness of the base plate remains below approx. 200% of the thickness of the substrate, it is expected that a processing of the substrate assembly would require no modifications or only minor modifications to the apparatuses that process the substrate and the attached base plate. As such, in accordance with the present invention, it is proposed to not merely transfer a substrate between different processing equipment but to transfer an assembly comprising the substrate and the attached base plate. Referring to the processes that take place in a lithographic apparatus, the present invention thus proposes that a substrate, with a base plate attached to it, is received by the apparatus, mounted to a substrate table, such as table WT, and is processed. Within the present invention, the assembly of a substrate and its attached based plate is also referred to as a substrate assembly.

As a result of the application of the base plate to the substrate, an assembly is obtained which has a substantially larger stiffness than the substrate itself. As a result, deformations of the substrate, due to the processing of the substrate and the clamping and unclamping, will be smaller. As a result, a pattern applied to the substrate can be better aligned with a previously applied pattern, resulting in an improved overlay.

In accordance with the present invention, various ways to attach the base plate to the substrate can be considered.

Figure 5:
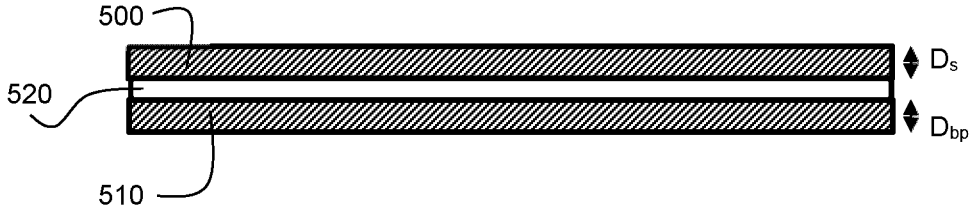
FIG. 5 schematically depicts a first embodiment of a substrate assembly according to the invention.

In an embodiment, the base plate can be attached to the substrate by means of a glue or a resin. FIG. 5 schematically shows such an embodiment of a substrate assembly according to the invention, the substrate assembly comprising a semiconductor substrate that is attached to a base plate according to the invention.

FIG. 5 schematically shows a cross-sectional view of a substrate 500 that is attached to a base plate 510 by means of a glue layer 520. In the embodiment as shown, the thickness $D_s$ of the substrate 500 is equal to the thickness $D_{bp}$ of the base plate 510. It can be pointed out that the thickness of the glue layer 520 is not up to scale compared to the thickness of the substrate 500 or the base plate 510. In an embodiment, the surface of the base plate 510 facing a bottom surface of the substrate is provided with a plurality of burls for supporting the substrate. Such an embodiment is shown in more detail below. In such embodiment, the glue or resin layer 520 may e.g. have a thickness corresponding to the length of the applied burls. Typically, burls having a length between 10 μm and 200 μm can be applied in a base plate according to the invention.

Within the meaning of the present invention, the surface of the substrate that faces the base plate is referred to as the bottom surface of the substrate. The opposite surface may be referred to as the top surface, i.e. the surface onto which the various processes such as applying resist, patterning, material deposition, etc. are applied. The surface of the base plate that faces the bottom surface of the substrate is referred to as the top surface of the base plate, the opposite surface of the base plate is thus referred to as the bottom surface. It should be pointed out that the references top and bottom do not imply that the substrate, the base plate or the substrate assembly need to be used in a particular position or orientation.

A suitable material or materials for the glue layer can be selected based on the operating conditions imposed by the sequence of processes to which the substrate and the attached base plate are subjected. In an embodiment, the glue layer can comprise a resin or the like. Operating conditions can e.g. include the temperature or temperature range to which the substrate assembly is subjected. In addition, It is preferred that the glue or resin does not expand or contract over time. It can further be pointed out that the objective of the glue or resin as applied is primarily to apply a normal force that forces or holds the substrate onto the baseplate, e.g. onto the burls of the base plate that face a bottom surface of the substrate. In such embodiment, the flatness and the stiffness of the burls of the base plate determine the occurring local angles and in-plane deformations. In an embodiment, the glue or resin can be selected to have a phase transition from liquid to solid at a suitable temperature, whereby the mounting of the substrate to the base plate is performed when the glue or resin is in the liquid phase and whereby the sequence of processes is performed with the resin or glue in the solid phase.

In an embodiment, the base plate is configured to be attached to the semiconductor substrate by capillary clamping. In such embodiment, a liquid is applied in between the base plate and the substrate, the liquid being configured to generate capillary forces pulling the substrate onto the base plate when the substrate is mounted to the base plate. In accordance with the present invention, the base plate can be configured to keep the liquid as applied in place so as to keep generating capillary forces throughout the sequence of processes. Note however that this does not mean that any spillage of the liquid is not allowed. Throughout the sequence of processes, the liquid applied can be replenished.

Figure 6:
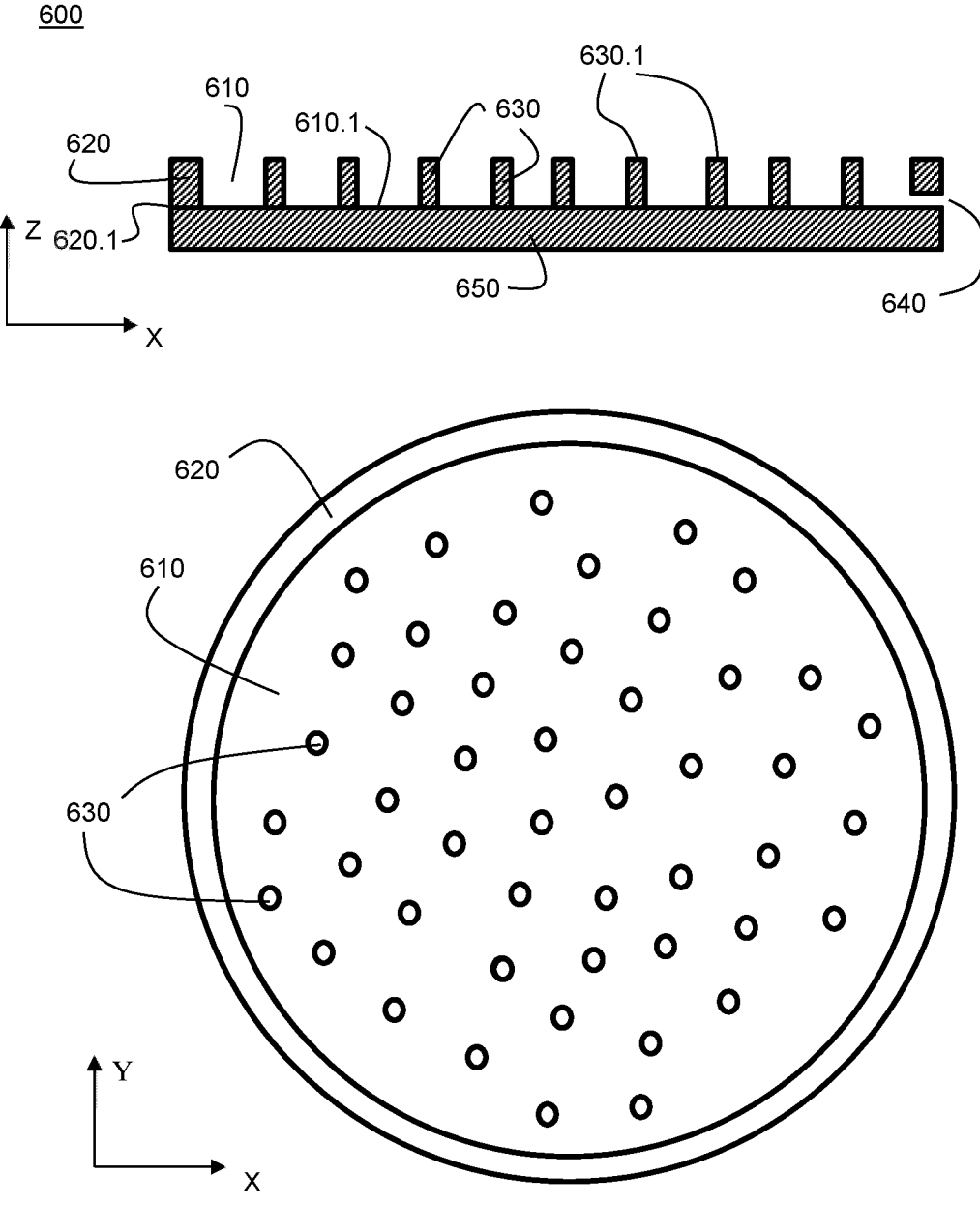
FIG. 6 schematically depicts a base plate according to an embodiment of the invention.

FIG. 6 schematically shows such an embodiment. The top part of FIG. 6 schematically shows a cross-sectional view of a base plate 600 according to the present invention, the base plate being configured to be attached to a semiconductor substrate by means of capillary clamping. In the embodiment as shown, the base plate 600 comprises a recess 610. In such a recess 610, a liquid can be provided for generating the required capillary forces. In the embodiment as shown, the base plate 600 comprises a rim 620 arranged along an outer contour 620.1 of the base plate 600. The rim 620 can also be considered to be an outer contour of the recess 610. The cross-sectional view of the base plate 600 further shows an inlet 640 for supplying a liquid to the recess 610. In an embodiment, the base plate may comprise one or more inlets for supplying a liquid to the recess 610. The one or more inlets 640 need not be arranged along the rim 620, they may also be provided through the body 650 of the base plate 600. The one or more inlets 640 may e.g. be provided with one-way valves or the like. Rather than using one or more inlets for supplying the liquid to the recess, the liquid can be poured into the recess to fill the recess, optionally followed by scribing a blade over the recess, to remove any excess liquid. When the recess is filled, the substrate can be put on top of the base plate.

In the embodiment as shown, the base plate 600 further comprises a plurality of burls 630 protruding from a bottom surface 610.1 of the recess 610. The plurality of burls 630, in particular the end surfaces 630.1 of the burls 630 can be configured to support a substrate. The purpose of the burls 630 is to provide a support surface, formed by the end surfaces 630.1 of the burls for a substrate. The end-surfaces of the burls are also configured to provide an in-plane friction force between the burls and the substrate, so as to ensure that, during use, the in-plane displacements of the substrate relative to the base plate 600 are kept to a minimum. In accordance with the present invention, in-plane displacements refer to displacements in a plane parallel to the top surface of base plate or the bottom surface of the semiconductor substrate. Referring to FIG. 6, top portion, the end surfaces 630.1 of the burls 630 thus ensure that when the base plate 600 is subjected to accelerations in the X-direction, a relative displacement between the base plate 600 and an attached substrate is substantially avoided. In particular, the in-plane friction force between the end surfaces 630.1 and the attached substrate, said friction force being caused by the capillary attraction between the substrate and the base plate, will ensure that an in-plane relative displacement between the base plate and the attached substrate is avoided.

In an embodiment, an end surface 620.2 of the rim 620 is substantially flush to the support surface formed by the end surfaces 630.1 of the burls 630. By doing so, spillage of the liquid during use can be minimized.

The bottom part of FIG. 6 schematically shows a top view of the base plate 600, illustrating the recess 610, the rim 620 and the plurality of burls 630 arranged in the recess 610.

In the embodiment as shown, the base plate 600 has a substantially circular in-plane shape. In accordance with the present invention, in-plane characteristics of the base plate refer to characteristics of the base plate in a plane parallel to the top surface of the base plate or the bottom surface of the semiconductor substrate. With reference to FIG. 6, bottom portion, this plane corresponds to the XY-plane as indicated.

In an embodiment of the present invention, the in-plane dimensions of the base plate substantially correspond to the in-plane dimensions of the semiconductor substrate that is being attached to the base plate. By doing so, the substrate assembly according to the present invention, i.e. an assembly of a substrate attached to a base plate according to the invention, can, to a large extent, be processed and handled by existing lithographic equipment and apparatuses. However, the increased weight, and increased thickness, due to the attached base plate, may require certain modifications to the equipment.

A base plate 600 as schematically shown in FIG. 6 may e.g. be manufactured by laser cutting or etching. Further examples of manufacturing processes are laser patterning, laser drilling, selective etching, DRIE (dry reactive ion etching). In an embodiment, a top surface of the base plate is first polished or lapped to obtain a desired roughness, followed by a laser patterning of the burl pattern, whereby all surfaces except the burls are lowered. If required, IBF (Ion Beam Figuring) can be applied to achieve the final flatness.

In an embodiment, the base plate according to the invention, is made from a material having a comparatively high stiffness, e.g. a stiffness higher than the stiffness of the substrate. The stiffness, e.g. expressed as Young's modulus, of a semiconductor substrate may e.g. be in the range of 130-185 GPa. In an embodiment of the present invention, the base plate, e.g. base plate 510 or 600, is made from a material having a Young's modulus >300 GPa. Having such a stiffness, combined with the preferred thickness as discussed above, will result in a substrate/base plate combination with a sufficient stiffness to reduce the deformation effects. In an embodiment, the base plate is made from Silicon carbide. Alternatively, a base plate made from SiSiC or Diamond can be considered as well.

Figure 7:
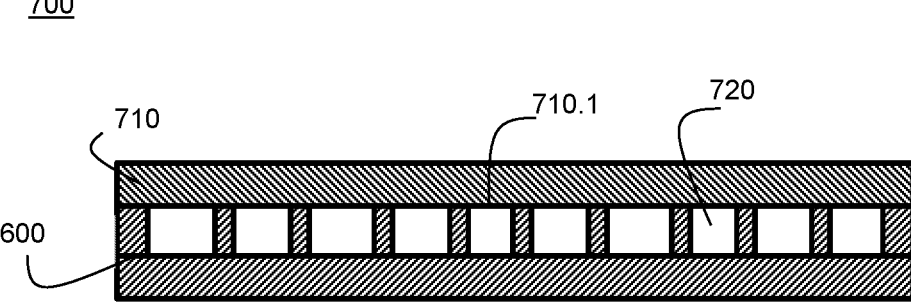
FIG. 7 schematically depicts a second embodiment of a substrate assembly according to the present invention.

FIG. 7 schematically shows a substrate assembly 700 according to the present invention, the substrate assembly 700 comprising a base plate 600 according to the present invention attached to a semiconductor substrate 710. In the assembled state, a liquid 720 is provided in the volume between the base plate 600 and a bottom surface 710.1 of the substrate 710, said volume being formed by the recess 610 of the base plate 600.

In an embodiment of the present invention, the liquid as provided to generate the capillary forces may e.g. be water or $CO_2$ water. Alternatively, isopropyl alcohol or ethylene glycol may be considered as well.

The substrate assembly 700 shown in FIG. 7 or the substrate assembly shown in FIG. 5 is intended to undergo different processes in order to create integrated circuits on the top surface of the semiconductor substrate. Such processes may include various lithographic processes including the application or removal of a resist layer, a development of a resist layer, a patterning of a resist layer, material deposition processes. In addition, a substrate may also be subjected to different measurement processes, e.g. using metrology tools such as e-beam inspection apparatus.

During the mentioned processes, the substrate assembly will typically be mounted to a support surface of an object table, e.g. an object table such as support table WT mentioned above. It is important to ensure that during said mounting no, or as little as possible, deformations of the substrate occur. It has been observed that ensuring that the contacting surfaces of the substrate and the base plate are sufficiently rough may facilitate this objective. in an embodiment, the substrate assembly is configured to be mounted to an object table which has a plurality of burls to support the substrate assembly. In case the end surfaces of these burls are sufficiently rough, there may not be a need to have a particular roughness for the bottom surface of the substrate assembly. However, due to wear, the end surfaces of the burls of the object table may become too smooth. It has been observed that, when combined with a flat or smooth bottom surface of the substrate assembly, in particular the bottom surface of the base plate, such an arrangement may cause the aforementioned deformations. In order to avoid this, it is proposed to, in an embodiment of the present invention, to provide a bottom surface of the base plate of the substrate assembly with a surface roughness above a predetermined threshold. In an embodiment, a bottom surface of the base plate is provided with an area surface roughness Sa (arithmetical mean height) above 1 nm, preferably in a range between 2.0 and 4.5 nm. By doing so, one can ensure that, even when the burls of the object table are worn, the deformations of the substrate are kept small or insignificant. As will be appreciated by the skilled person, the various measures as proposed in the present invention, result, when combined, in a certain effect. In case a comparatively thick and rigid base plate is selected, the applied roughness may be more relaxed, i.e. lower compared to when a comparatively thin and less rigid base plate is selected. Phrased differently: the stiffer the base plate is compared to the substrate, the lower the deformation of the substrate will be. Provided that the deformation is constant over time, i.e. does not change during the sequence of processes, overlay errors between consecutive layers on the substrate can be mitigated with the invention. In order to have such a substantially constant deformation over time, the manner in which the substrate assembly, i.e. the combination of a substrate and a base plate according to the invention, is mounted to the object table may be important as well, in particular when the base plate is not very stiff. When the base plate is comparatively stiff and rather thick, the deformations will remain low during clamping and in general, irrespective of the roughness of the bottom surface of the base plate. The rougher the bottom surface of the base plate, the more slip may occur during the clamping process, resulting in less forces acting on the base plate and thus less deformations.

Figure 8:
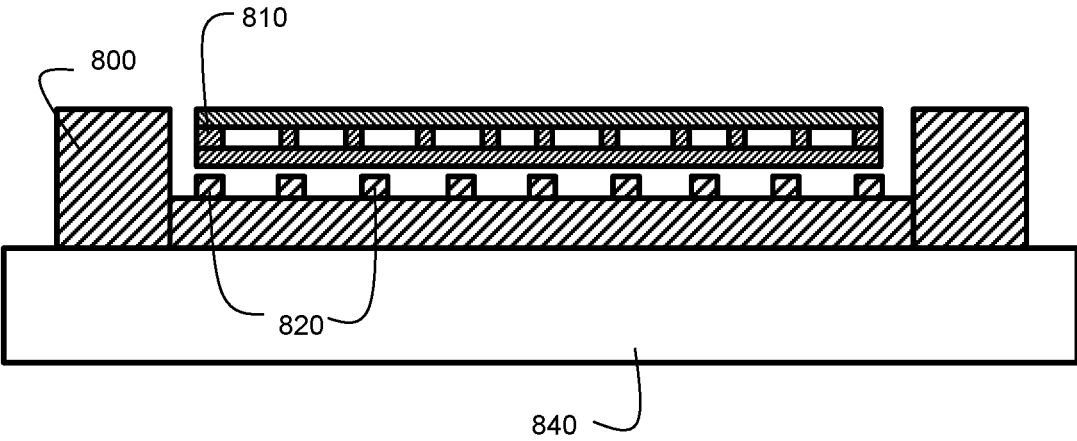
FIG. 8 schematically depicts an object table according to the invention.

FIG. 8 schematically shows an object table according to the present invention, which can be applied during a processing of a substrate assembly according to the present invention, e.g. a processing in a lithographic apparatus or an inspection tool. In particular, FIG. 8 schematically shows a cross-sectional view of an object table 800 that is configured to hold and support a substrate assembly 810 according to the present invention. The substrate assembly 810 can e.g. correspond to the substrate assembly shown in FIG. 5 or 7. In the embodiment as shown, the object table 800 comprises a plurality of burls 820 onto which the substrate assembly 810 can be supported. In order to hold the substrate assembly 810 onto the burls, the object table 800 further comprises a clamping mechanism to attract the substrate assembly 810 onto the burls 820. Such a clamping mechanism may e.g. comprise a vacuum clamp or an electrostatic clamp. In an embodiment, the burls 820 of the object table 800 can e.g. be made from a wear-resistance material, e.g. SiSiC.

In case of an electrostatic clamping mechanism for clamping the substrate assembly 810 to the object table 800, it may be advantageous to ensure that the substrate assembly, in particular the base plate of the substrate assembly is electrically conductive or comprises one or more electrical conductors. In an embodiment, such conductors can be embedded in the bottom surface of the base plate. Alternatively, or in addition, the bottom surface of the base plate can be provided with an electrically conductive coating or film.

In the embodiment as shown, the object table 800 is mounted to a positioning device 840. Such a positioning device 840 can e.g. comprise multiple actuators or motors, e.g. piezo-electric or electromagnetic actuators or motors, to position the object table 800 in one or more degrees of freedom.

In an embodiment of the present invention, the object table 800 may be provided with one or more sensors or parts thereof. As an example, the top surface 800.1 of the object table 800 can be provided with optical encoders cooperating with one or more gratings to determine a position of the object table 800. As another example, the top surface 800.1 or the side surface 800.2 of the object table may serve as a target for a measurement beam of an interferometer system to determine a position of the object table 800.

Figure 9:
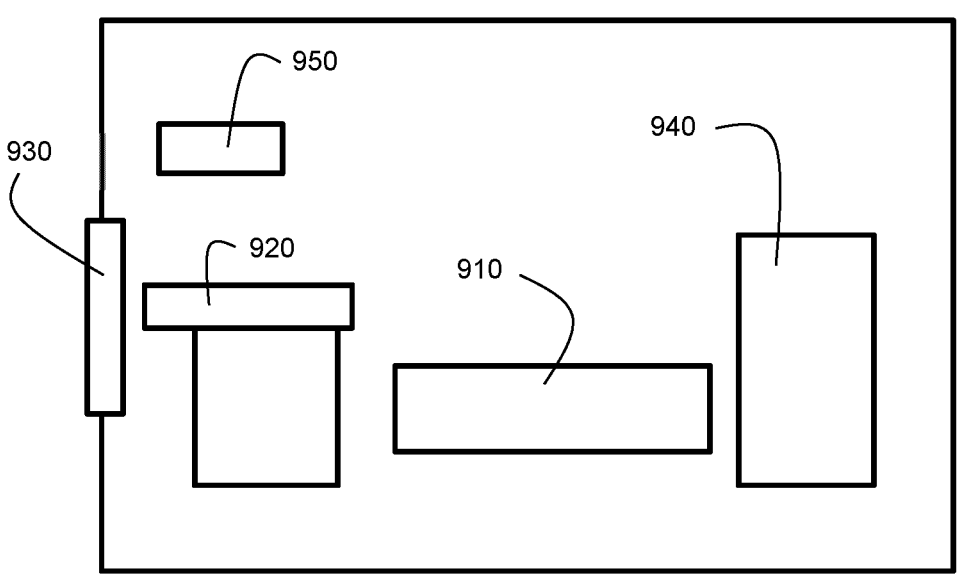
FIG. 9 schematically depicts an apparatus according to the invention.

According to an aspect of the present invention, there is provided an apparatus for attaching a base plate according to the present invention to a semiconductor substrate. Such an apparatus is schematically shown in FIG. 9. In the embodiment as shown, the apparatus 900 comprises a support member 910 that is configured to support a base plate such as a base plate according to the invention. The apparatus 900 further comprises a transport unit 920 that is configured to receive a semiconductor substrate and position the semiconductor substrate. In the embodiment as shown, the apparatus comprises a port 930 via which semiconductor substrates and base plates can be supplied to the apparatus. The same port 930 may also be configured to output a substrate assembly according to the invention, i.e. a substrate assembly comprising a semiconductor substrate and a base plate attached to it. Alternatively, the apparatus can comprise multiple ports, e.g. an input port and an output port. In the embodiment as shown the apparatus further comprises a processing unit 940 configured to releasably attach a semiconductor substrate to a base plate.

In an embodiment, the transport unit 920 can be configured to receive a base plate, e.g. via the port 930 and position the base plate on the support member 910. Subsequently, the transport unit 920 can receive a semiconductor substrate, e.g. via the port 930 and position it relative to the base plate, in order to attach it to the base plate. In an embodiment, the processing unit can e.g. be configured to apply a glue layer or a resin layer to a surface of the base plate facing a bottom surface of the semiconductor substrate. When the glue layer or resin layer is applied, the transport unit 920 can be configured to press the bottom surface of the substrate onto the glue layer to attach the semiconductor substrate to the base plate. When the glue has cured, the transport unit 920 can output the substrate assembly. In such embodiment, the apparatus 900 can also comprise a heating unit 950 that is configured to heat the glue or resin to a liquid state. Once the glue or resin is in a liquid state, it can be applied to the surface of the base plate facing the bottom surface of the substrate. In an embodiment, said surface of the base plate is a bottom surface of a recess of the base plate. In such embodiment, the liquid glue or resin can thus be poured into the recess. As mentioned above, the recess can e.g. be provided with a plurality of burls. It can also be pointed out that the glue or resin layer may also be applied to the bottom surface of the substrate.

In another embodiment, the processing unit 940 can be configured to apply a capillary clamping to releasably attach the semiconductor substrate to the base plate. In such embodiment, the processing unit 940 can be configured to supply a liquid in a recess of the base plate, whereupon the transport unit 930 can position a bottom surface of the substrate onto the liquid, in order to establish the capillary clamping between the substrate and the base plate.

Figure 10:
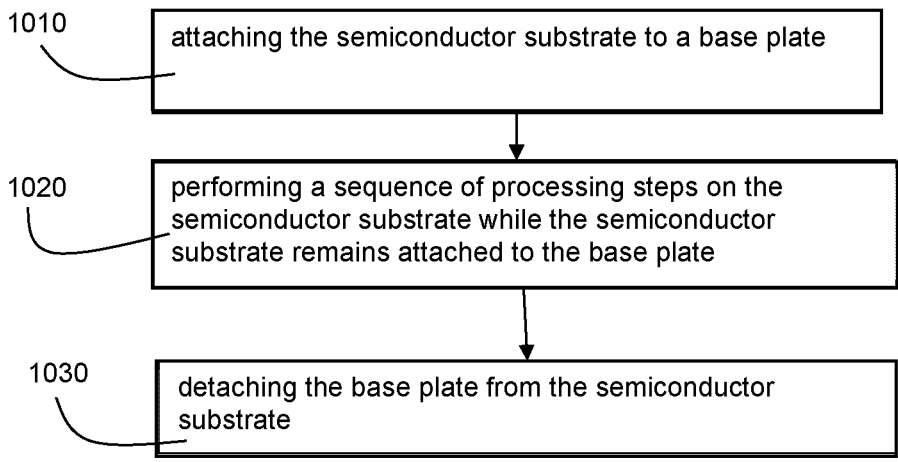
FIG. 10 schematically depicts a flow-chart of a method according to the invention.

In accordance with another aspect of the present invention, there is provided a method of processing a semiconductor substrate in which a base plate or substrate assembly according to the invention can advantageously be applied. A flow-chart according to the invention is schematically shown in FIG. 10. FIG. 10 schematically shows a flow-chart of a method 1000 of processing a semiconductor substrate according to the present invention, the method comprising a first step 1010 of attaching the semiconductor substrate to a base plate, e.g. a base plate according to the invention. The method 1000 further comprises a second step 1020 of performing a sequence of processing steps on the semiconductor substrate while the semiconductor substrate remains attached to the base plate. The method further comprises a third step 1030 of detaching the base plate from the semiconductor substrate. The method of processing the substrate 1000 according to the invention thus enables the processing of a substrate during a sequence of processing steps, while maintaining the substrate attached to the base plate. By doing so, a deformation of the substrate during the different processes of the sequence is mitigated, thus enabling a more accurate patterning of consecutive layers on the substrate.

According to an aspect of the present invention there is provided a lithographic apparatus configured to process a substrate assembly according to the invention. Typical components of such a lithographic apparatus are described above with reference to FIGS. 1 to 3. In order to process the substrate assembly according to the invention, minor modifications may need to be made to a known lithographic apparatus, e.g. to take account of the thickness and weight of the substrate assembly compared to the thickness and weight of a single substrate.

The embodiments may further be described using the following clauses:

1. A base plate configured to be attached to a semiconductor substrate, whereby the base plate is configured to remain attached to the semiconductor substrate during a sequence of processing steps performed on the semiconductor substrate, and whereby a thickness of the base plate is in a range between 50% to 200% of a thickness of the semiconductor substrate.

2. The base plate according to clause 1, whereby a planar size of the base plate substantially corresponds to a planar size of the semiconductor substrate.

15

3. The base plate according to any of the clauses 1 to 2, whereby the base plate is made from a material having a Young's modulus larger than 300 GPa.

4. The base plate according to clause 3, wherein the material is Silicon carbide (SiC).

5. The base plate according to any of the preceding clauses whereby the base plate has a top surface configured to face a bottom surface of the semiconductor substrate and a bottom surface configured to face away from the semiconductor substrate.

6. The base plate according to clause 5, wherein the bottom surface has a roughness Sa larger than 1 nm.

7. The base plate according to any of the clauses 5 to 6, whereby the bottom surface of the base plate is configured to be mounted to an object table.

8. The base plate according to clause 7, whereby the base plate is configured to be electrostatically clamped to the object table.

9. The base plate according to clause 8, whereby the base plate comprises one or more electrical conductors.

10. The base plate according to clause 9, wherein the one or more electrical conductors are embedded in the bottom surface of the base plate.

11. The base plate according to any of the preceding clauses, whereby the base plate is configured to be glued to the semiconductor substrate.

12. The base plate according to clause 11, whereby the base plate is configured to be glued to the semiconductor substrate using a resin or a glue.

13. The base plate according to clause 12, wherein the base plate has a recess for receiving the resin or the glue.

14. The base plate according to clause 13, further comprising a plurality of burls protruding from a bottom surface of the recess, the bottom surface configured to, during use, face the semiconductor substrate.

15. The base plate according to any of the clauses 1 to 10, whereby the base plate is configured to be attached to the semiconductor substrate by capillary clamping.

16. The base plate according to clause 15, whereby the base plate comprises a recess configured to receive a liquid.

17. The base plate according to clause 15, whereby the base plate further comprises a rim arranged along a contour of the base plate, the rim being configured to substantially contain the liquid in the recess.

18. The base plate according to clause 16 or 17, further comprising a plurality of burls protruding from a bottom surface of the recess.

19. The base plate according to clause 18, whereby a plurality of end surfaces of the respective plurality of burls are configured to contact the semiconductor substrate.

20. The base plate according to any of the clauses 16 to 19, further comprising one or more inlets for supplying the liquid to the recess.

21. The base plate according to any of the preceding clauses, whereby the sequence of processing steps comprises:
a first processing step performed on the semiconductor substrate in a first apparatus;
a second processing step of transporting the semiconductor substrate and the attached base plate to a second apparatus, and
a third processing step performed on the semiconductor substrate in the second apparatus

22. The base plate according to any of the preceding clauses, whereby the base plate, when attached to the semiconductor substrate, is configured to be used in several sequential processing steps in a semiconductor manufacturing process.

23. The base plate according to clause 22, whereby the several sequential processing steps comprise:
a first processing step performed on the semiconductor substrate in a first apparatus;
a second processing step of transporting the semiconductor substrate and the attached base plate to a second apparatus, and
a third processing step performed on the semiconductor substrate in the second apparatus 24. A substrate assembly comprising a semiconductor substrate and a base plate according to any of the preceding clauses, whereby the semiconductor substrate is attached to the base plate.

25. The substrate assembly according to clause 24, whereby the semiconductor substrate is glued to the base plate using a glue or a resin.

26. The substrate assembly according to clause 25, whereby the glue or resin has a melting temperature in a range between 0° C. and 100° C.

27. An object table comprising a clamping mechanism configured to clamp a base plate according to any of the clauses 1 to 23.

28. The object table according to clause 27, wherein the clamping mechanism comprises a vacuum clamping mechanism or an electrostatic clamping mechanism.

29. A method of processing a semiconductor substrate, the method comprising:
attaching the semiconductor substrate to a base plate according to any of the preceding clauses;
performing a sequence of processing steps on the semiconductor substrate while the semiconductor substrate remains attached to the base plate;
detaching the base plate from the semiconductor substrate.

30. The method according to clause 29, wherein performing a sequence of processing steps comprises:
performing a first process on the semiconductor substrate in a first apparatus;
transporting the semiconductor substrate and the attached base plate to a second apparatus, and
performing a second process on the semiconductor substrate in the second apparatus.

31. The method according to clause 29, wherein performing a sequence of processing steps comprises:
applying a layer of resist to the semiconductor substrate;
patterning the layer of resist using a lithographic apparatus;
developing the patterned layer of resist.

32. The method according to any of the clauses 29 to 31 wherein the step of performing a sequence of processing steps is performed multiple times.

33. Apparatus for attaching a base plate to a semiconductor substrate, the apparatus comprising:
a support member configured to support a base plate;
a transport unit configured to receive the semiconductor substrate and position the semiconductor substrate;
a processing unit configured to releasably attach the semiconductor substrate to the base plate.

34. The apparatus according to clause 33, wherein the processing unit is configured to apply a glue layer or a resin layer to a surface of the base plate facing a bottom surface of the semiconductor substrate and whereby the transport unit is configured to arrange the bottom surface onto the glue layer or the resin layer to attach the semiconductor substrate to the base plate.

35. The apparatus according to clause 34, further comprising a heating unit configured to heat a glue or resin to a liquid state.

36. The apparatus according to clause 33, whereby the processing unit is configured to apply a capillary clamping to releasably attach the semiconductor substrate to the base plate.

37. The apparatus according to clause 36, whereby the processing unit is configured to supply a liquid in a recess of the base plate.

38. The apparatus according to clause 37, wherein the transport unit is configured to position a bottom surface of the substrate onto the liquid.

39. The apparatus according to any of the clauses 33 to 38, wherein the transport unit is configured to output the substrate together with the attached base plate.

40. A lithographic apparatus comprising an object table according to any of the clauses 27 to 28.

41. A lithographic apparatus configured to process a substrate assembly according to any of the clauses 24 to 26.

42. A base plate configured to be attached to a semiconductor substrate, wherein the base plate is configured to remain attached to the semiconductor substrate during a sequence of processing steps performed on the semiconductor substrate, and wherein the base plate is made from a material having a Young's modulus larger than 300 GPa.

43. The base plate according to clause 42, wherein a planar size of the base plate substantially corresponds to a planar size of the semiconductor substrate, and wherein a thickness of the base plate is in a range between 50% to 200% of a thickness of the semiconductor substrate.

44. The base plate according to clause 42 or 43, wherein the base plate comprises Silicon Carbide (SiC) or diamond.

45. A base plate configured to be attached to a semiconductor substrate, wherein the base plate is configured to remain attached to the semiconductor substrate during a sequence of processing steps performed on the semiconductor substrate, and wherein the base plate comprises Silicon Carbide (SiC).

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A base plate configured to be attached to a semiconductor substrate, wherein the base plate is configured to remain attached to the semiconductor substrate during a sequence of processing steps performed on the semiconductor substrate that includes removal of the semiconductor substrate and base plate together from a support for placement of the semiconductor substrate on another support, and wherein the base plate is made from a material having a Young's modulus larger than 300 GPa.

2. The base plate according to claim 1, wherein a planar size of the base plate substantially corresponds to a planar size of the semiconductor substrate, and wherein a thickness of the base plate is in a range between 50% to 200% of a thickness of the semiconductor substrate.

3. The base plate according to claim 1, wherein the base plate comprises silicon carbide or diamond.

4. The base plate according to claim 1, wherein the base plate has a top surface configured to face a bottom surface of the semiconductor substrate and a bottom surface configured to face away from the semiconductor substrate, and wherein the bottom surface has a roughness Sa larger than 1 nm.

5. The base plate according to claim 4, wherein the bottom surface of the base plate is configured to be mounted to an object table.

6. The base plate according to claim 5, wherein the base plate is configured to be electrostatically clamped to the object table.

7. The base plate according to claim 1, wherein the base plate is configured to be attached to the semiconductor substrate using a resin or a glue.

8. The base plate according to claim 7, wherein the base plate comprises a recess for receiving the resin or the glue.

9. The base plate according to claim 8, further comprising a plurality of burls protruding from a bottom surface of the recess, the bottom surface configured to, during use, face the semiconductor substrate.

10. The base plate according to claim 1, configured to be attached to the semiconductor substrate by capillary clamping.

11. The base plate according to claim 1, wherein the base plate, when attached to the semiconductor substrate, is configured to be used in several sequential processing steps in a semiconductor manufacturing process.

12. A substrate assembly comprising a semiconductor substrate and the base plate according to claim 1, wherein the semiconductor substrate is attached to the base plate.

13. An object table comprising a clamping mechanism configured to clamp the substrate assembly according to claim 12.

14. A method of processing a semiconductor substrate, the method comprising:

attaching the semiconductor substrate to the base plate according to claim 1;

performing a sequence of processing steps on the semiconductor substrate while the semiconductor substrate remains attached to the base plate; and detaching the base plate from the semiconductor substrate.

15. An apparatus for attaching a base plate to a semiconductor substrate, the apparatus comprising:

a support member configured to support the base plate according to claim 1;

a transport unit configured to receive the semiconductor substrate and position the semiconductor substrate; and a processing unit configured to releasably attach the semiconductor substrate to the base plate.

16. The apparatus according to claim 15, wherein the processing unit is configured to apply a glue layer or a resin layer to a surface of the base plate facing a bottom surface of the semiconductor substrate and the transport unit is configured to arrange the bottom surface onto the glue layer or the resin layer to attach the semiconductor substrate to the base plate.

17. The apparatus according to claim 15, wherein the processing unit is configured to apply a capillary clamping to releasably attach the semiconductor substrate to the base plate.

18. The apparatus according to claim 17, wherein the processing unit is configured to supply a liquid in a recess of the base plate.

19. The apparatus according to claim 15, wherein the transport unit is configured to output the substrate together with the attached base plate.

20. A base plate configured to be attached to a semiconductor substrate, wherein the base plate is configured to remain attached to the semiconductor substrate during a sequence of processing steps performed on the semiconductor substrate that includes removal of the semiconductor substrate and base plate together from a support for placement of the semiconductor substrate on another support, and wherein the base plate comprises SiC (silicon carbide), SiSiC (silicon infiltrated silicon carbide or siliconized silicon carbide) or diamond.

\* \* \* \* \*